United States Patent [19]
Freyman et al.

[11] Patent Number: 5,646,451
[45] Date of Patent: Jul. 8, 1997

[54] MULTIFUNCTIONAL CHIP WIRE BONDS

[75] Inventors: Ronald Lamar Freyman; Craig Joseph Garen, both of Bethlehem; Clinton Hays Holder, Jr., Slatington; Robert Nelson Kershaw, Harleysville; Edward Clayton Morgan, Macungie, all of Pa.

[73] Assignee: Lucent Technologies Inc., Murray Hill, N.J.

[21] Appl. No.: 486,844

[22] Filed: Jun. 7, 1995

[51] Int. Cl.[6] .................................................. H01L 21/60
[52] U.S. Cl. ........................................ 257/784; 228/180.5
[58] Field of Search ................................ 228/4.5, 180.5; 257/784, 786

[56] References Cited

U.S. PATENT DOCUMENTS

| | | | |
|---|---|---|---|
| 3,478,229 | 11/1969 | Avery | 257/786 X |
| 4,558,345 | 12/1985 | Dwyer et al. | 257/786 |
| 4,800,393 | 1/1989 | Edward et al. | 343/821 |
| 5,142,239 | 8/1992 | Brayton et al. | 350/66 |
| 5,386,936 | 2/1995 | Mochida et al. | 228/102 |
| 5,395,038 | 3/1995 | Olson et al. | 228/180 |

OTHER PUBLICATIONS

PTO 1449.

Primary Examiner—Kenneth J. Ramsey
Attorney, Agent, or Firm—David M. Sigmond; David L. Smith

[57] ABSTRACT

A multifunctional chip includes first and second electrically isolated bonding pads. The chip also includes a control circuit coupled to the second bonding pad. The control circuit commands the chip to perform the first function if the first and second bonding pads are coupled. Alternatively, the control circuit commands the chip to perform the second function if the first and second bonding pads remain electrically isolated. The coupling or isolation between the first and second bonding pads is determined by wire bonds. Therefore, the use of wire bonds selects the function for the chip.

21 Claims, 3 Drawing Sheets

MULTIFUNCTIONAL CHIP WIRE BONDS

TECHNICAL FIELD

The invention relates generally to multifunctional chips, and more particularly to selecting a specific function for a multifunctional chip by use of wire bonds.

BACKGROUND OF THE INVENTION

Multifunctional integrated circuit chips are capable of providing two or more functions. Multifunctional chips often include a control circuit for selecting one of the functions. By selecting the appropriate function, the multifunctional chip becomes functionally identical to corresponding single-function chips. In this manner, multifunctional chips may replace various single-function chips. This flexibility can greatly reduce product development times and costs where each chip, whether multifunctional or single-function, requires a unique mask set.

Various techniques exist for selecting the desired function of a multifunctional chip. For instance, the multifunctional chip may be mounted on a customizable substrate, with the substrate customized to select the appropriate function. For instance, a laser beam may be used to selectively direct-write a met routing pattern on the substrate, or to selectively cut existing metallization on the substrate. Or, the leads of the substrate may be selectively coupled by appropriate jumper wires.

Connections between chips and substrates commonly performed by one of three technologies: wire bonding, controlled collapse chip connections (C4 or flip chip) and tape automated bonding (TAB). Typical wire bonds are gold or aluminum, and a typical wire bonding temperature is 225° C. It may be desirable, for instance, to make a wire bond using a ball bond at the chip and a wedge bond at the substrate. Wire bonds provide a relatively low cost per connection and increase thermal dissipation from the chip.

Wire bonds have also been used to select the function of a multifunctional chip. For instance, a terminal may be wire bonded to a first bonding pad to select a first function, or to a second bonding pad to select a second function. Similarly, a bonding pad may be wire bonded to a first terminal to select a first function, or to a second terminal to select a second function. In either case, at least one terminal must be dedicated to selecting the chip function.

Multiple wire bonds are also known in the am In multiple wire bonds, separate wire bonds fan-out from a single terminal to multiple pads so that each pad is connected to the terminal by a separate wire bond. Thus, a single terminal may be double wire bonded to two bonding pads, triple wire bonded to three bonding pads, and so on. One purpose of multiple wire bonds is to reduce inductance. For instance, double wire bonds are used to couple a single power supply terminal to two adjacent bonding pads. A significant advantage of these double wire bonds is to reduce undesired inductive effects, such as noise and ground-bounce, that may arise in single wire bonds connected to power supply terminals.

Stitch bonding provides a convenient method of making double wire bonds. With stitch bonding, a wire is bonded to one of the bonding pads, then the wire is bonded to the terminal, then the wire is bonded to the second bonding pad, where the wire is then cut. This effectively provides a double wire bond with only one bonding operation.

A primary shortcoming and deficiency of the conventional approaches is the failure to teach a more versatile approach to using wire bonds for selecting various functions of a multifunctional chip.

SUMMARY OF THE INVENTION

A primary aspect of the present invention is the use of multiple wire bonds for selecting various functions of a multifunctional chip.

In accordance with an embodiment of the invention, a multifunctional chip includes first and second electrically isolated bonding pads. The chip also includes a control circuit coupled to the second bonding pad. The control circuit commands the chip to perform the first function if the first and second bonding pads are coupled. Alternatively, the control circuit commands the chip to perform the second function if the first and second bonding pads remain electrically isolated. The coupling or isolation between the first and second bonding pads is determined by wire bonds. Therefore, the use of wire bonds selects the function for the chip.

To select the first function, the first bonding pad is wire bonded to an external terminal, and the second bonding pad is separately wire bonded to the same terminal, thereby forming a double wire bond and coupling the pads. To select the second function, the second bonding pad is devoid of a wire bond, thereby leaving the pads electrically isolated. If the second function is selected, the first bonding pad may still be wire bonded to the terminal. In other words, the first bonding pad may be wire bonded to the terminal regardless of which function is selected. In this manner, the terminal may couple various signals to the first bonding pad, such as power supply voltages or data signals. As a result, the terminal need not be dedicated solely to selecting the chip function. This provides a distinct advantage over the conventional approach described in the background section in which a terminal is dedicated solely for selecting the chip function.

BRIEF DESCRIPTION OF THE DRAWING

The invention, together with its various features and advantages, can be readily understood from the following detailed description taken in conjunction with the accompanying drawings, in which.

DETAILED DESCRIPTION

Figure 1:
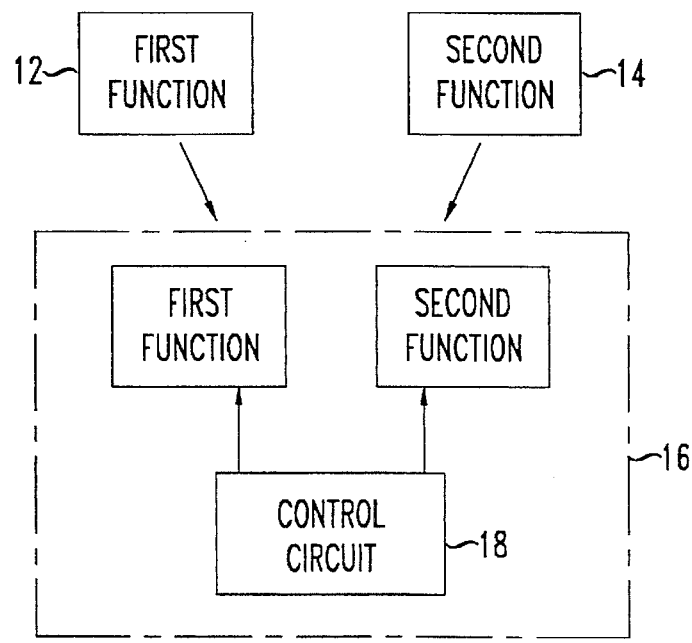
FIG. 1 is a simplified schematic diagram of a relationship between a multifunctional chip and various single-function chips.

Referring to FIG. 1, there is shown a simplified schematic diagram of a relationship between a multifunctional chip and various single-function chips. Single-function chip 12 is capable of providing a first function. Single-function chip 14 is capable of providing a second function. Multifunctional chip 16 is capable of providing the first function and the second function. Multifunctional chip 16 includes a control circuit 18 for choosing one of the functions. That is, control circuit 18 commands chip 16 to perform either the first function or the second function. Therefore, chip 16 provides a replacement for a selected one of chips 12 and 14.

Chip 16 may include a first circuit for performing the first function and a second circuit for performing the second function. The first and second circuits may include completely separate elements (diodes, transistors, buses, etc.) of chip 16. More likely, certain elements will be exclusive to the first circuit, other elements will be exclusive to the second circuit, and still other elements (such as bonding pads) will be shared by the first and second circuits. In addition, the first and second circuits may share the vast majority of elements, or use the same elements in different ways. It is also possible that the first circuit can be a subset of the second circuit, and vice-versa.

Suppose, for example, chips 12 and 14 are essentially identical digital signal processors except that chips 12 and 14 include differently encoded ROMs. Multifunctional chip 16 may be similar to chips 12 and 14, yet also include both ROMs and control circuit 18 for choosing between the ROMs. In this case, chip 16 performs one of two digital signal processing functions depending on which ROM is selected. As another example, chips 12 and 14 may be essentially identical digital signal processors except that chip 12 operates with 3 volt signals and chip 14 with 5 volt signals. In this case, multifunctional chip 16 may be designed to operate on 3 or 5 volt signals, depending on which is specified by control circuit 18. More generally, multifunctional chip 16 may be capable of performing N functions (with N being an integer of 2 or more) exactly as performed by N single-function chips. By providing a set of N identical multifunctional chips, then selecting their respective functions, the set of N multifunctional chips can replace N single-function chips.

Figure 2:
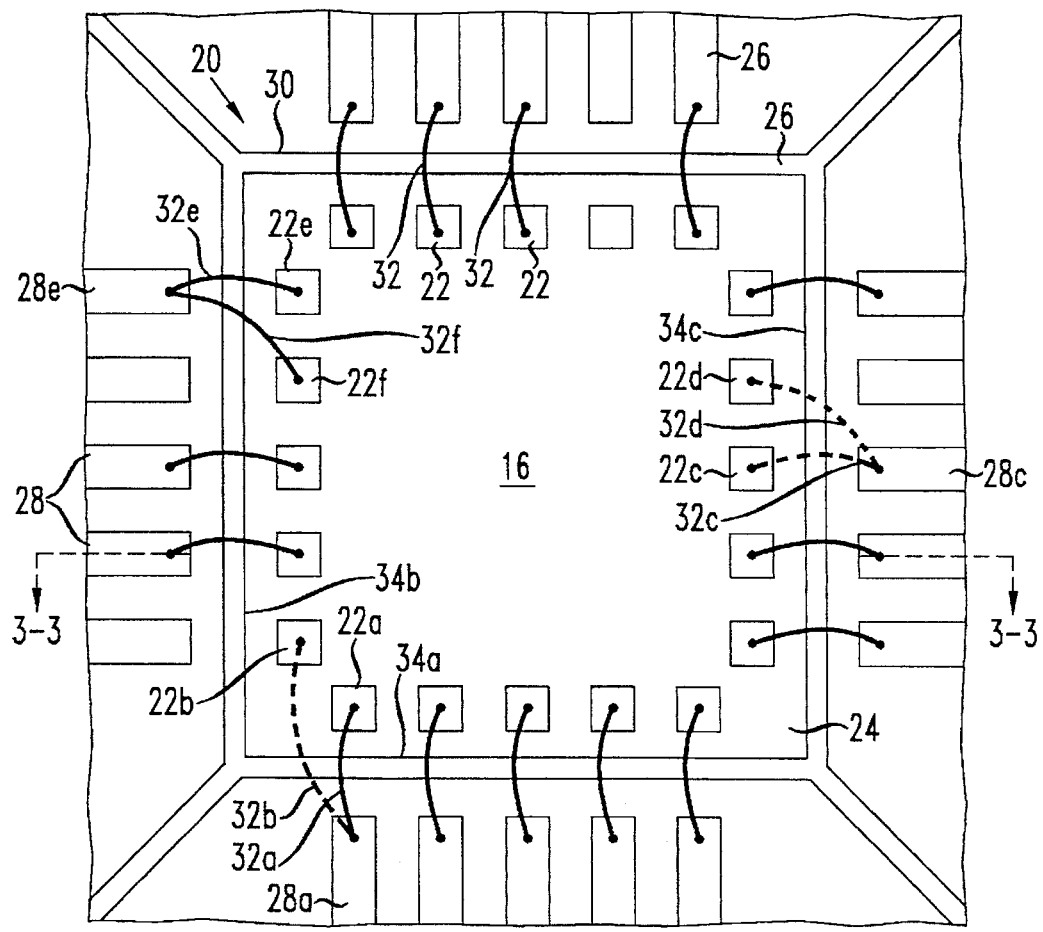
FIG. 2 is a simplified top plan view of an assembly comprising a multifunctional chip, a substrate, and wire bonds in accordance with an embodiment of the present invention.

Referring to FIG. 2, there is shown a simplified top plan view of an assembly 20 comprising a multifunctional chip, a substrate, and wire bonds in accordance with an embodiment of the present invention. As is seen, chip 16 includes a plurality of separate bonding pads 22 peripherally disposed about major surface 24. Bonding pads 22 are adapted to receive wire bonds. Chip 16 is received by substrate 26, comprising a plurality of conductive terminals 28 disposed near bonding pads 22. Terminals 28 are also adapted to receive wire bonds. For illustration purposes, substrate 26 is shown as a leadframe, comprising die paddle 30 upon which chip 16 is mounted, and separate spaced finger-type leads as terminals 28. It is understood that substrate 26 may be a single-chip package, a multi-chip module, a copper-polyimide interconnect, various level-1 packages, or any other component associated with chip 16 which includes conductive terminals adapted to receive wire bonds connected to chip 16.

Assembly 20 also comprises a plurality of wire bonds 32 connected between various bonding pads 22 and terminals 28. The only external electrical connections to bonding pads 22 are wire bonds 32. Thus, any bonding pad 22 not receiving a wire bond 32 is devoid of an external electrical connection. Optional wire bonds 32b, 32c and 32d are shown as broken lines. The absence or presence of the optional wire bonds is used to select the function for chip 16.

More particularly, chip 16 does not couple bonding pads 22a and 22b. Bonding pad 22a is wire bonded by wire bond 32a to terminal 28a. Control circuit 18 (not shown in FIG. 2) in chip 16 is coupled to bonding pad 22b. If optional wire bond 32b is present, then bonding pad 22b is coupled to terminal 28a, thereby coupling bonding pads 22a and 22b. As a result, control circuit 18 commands chip 16 to perform the first function. If, on the other hand, optional wire bond 32b is absent, then bonding pad 22b remains electrically isolated from bonding pad 22a. Under this condition, control circuit 18 by default commands chip 16 to perform the second function. Preferably, control circuit 18 holds bonding pad 22b at a default voltage, rather than allowing bonding pad 22b to float. Therefore, the selection of the first or second function depends on the respective presence or absence of optional wire bond 32b.

Optional wire bond 32b may be formed using stitch bonding so that a single continuous bonding wire provides wire bonds 32a and 32b. In this instance, a first end of the bonding wire is bonded to pad 22a, an intermediate portion of the bonding wire is bonded to terminal 28a, then a second end of the bonding wire is bonded to pad 22b, where the bonding wire is cut. Wire bonds 32a and 32b may also be formed using separate pieces of bonding wire in separate wire bonding operations.

As mentioned above, double wire bonds may be useful in reducing undesired inductive effects. Generally, the closer the double wire bonds are to one another, the greater the reduction of inductance. Therefore, preferably the ends of wire bonds 32a and 32b at terminal 28a are closer to one another than the opposite ends of wire bonds 32a and 32b at bonding pads 22a and 22b, respectively. The ends of wire bonds 32a and 32b at terminal 28a may be quite close to one another, or in direct contact with one another.

As a further illustration, chip 16 is also capable of providing a third and fourth function. Chip 16 does not couple bonding pads 22c and 22d. Optional wire bond 32c is shown between terminal 28c and bonding pad 22c, and optional wire bond 32d is shown between bonding pad 22d and terminal 28c. Although not shown, control circuit 18' (similar to control circuit 18) in chip 16 is coupled to bonding pad 22d for choosing between the third and fourth functions. The presence or absence of optional wire bonds 32c and 32d is used to select between the third and fourth functions. If optional wire bonds 32c and 32d are present then bonding pads 22c and 22d are coupled and the third function is selected. Alternatively, if optional wire bonds 32c and 32d are absent then bonding pads 22c and 22d remain electrically isolated and the fourth function is selected.

Much of the discussion concerning bonding pads 22a and 22b applies to bonding pads 22c and 22d. However, several distinctions are made for illustration purposes. For example, wire bond 32a is mandatory, regardless of whether the second function is selected and optional wire bond 32b is present, whereas wire bond 32c is present only if the fourth function is selected and optional wire bond 32d is also present.

By way of example, the first function may include using a first ROM on chip 16, the second function may include using a second ROM on chip 16, the third function may include using 5 volt signals for chip 16, and the fourth function may include using 3 volt signals for chip 16. Thus, the first and second functions need not necessarily have any relationship to the third and fourth functions. Furthermore, functions (such as a fifth and sixth function) may be made available for selection in a similar manner.

Terminal 28a may be coupled to an external voltage source, such as a positive voltage or ground, so that the external voltage source applies the first voltage to bonding pad 22b is optional wire bond 32b is present. Terminal 28c, however, may not be coupled to an external voltage source. That is, terminal 28c is either coupled to chip 16 or it floats. In this instance, the first voltage (such as a positive voltage or ground) would be applied from bonding pad 22c to bonding pad 22d by the path of optional wire bond 32c, terminal 28c, and optional wire bond 32d.

As illustrated, bonding pads 22a and 22b are adjacent to one another, as are bonding pads 22c and 22d. This arrangement is normally preferred when making multiple wire bonds in order to avoid unduly long wire bonds and entanglement with other wire bonds. It is not, however, essential that bonding pads 22a and 22b be adjacent to one another. As is seen, bonding pads 22a and 22b are adjacent to respective adjoining sides 34a and 34b of chip 16, whereas pads 22c and 22d are adjacent to single side 34c of chip 16. Terminal 28a is advantageously as close or closer to bonding pad 22a than to bonding pad 22b since wire bond 32a is mandatory whereas wire bond 32b is optional, depending on the desired function. The relative placement of terminals 28 with respect to bonding pads 22 is a matter of design choice.

Terminal 28e contains a double wire bond, comprising wire bond 32e connected to power supply bonding pad 22e and wire bond 32f connected to power supply bonding pad 22f. The double wire bond at terminal 28e is unrelated to selecting a function for chip 16, and instead is used for the primary purpose of reducing undesired inductive effects, as is conventional.

Figure 3:
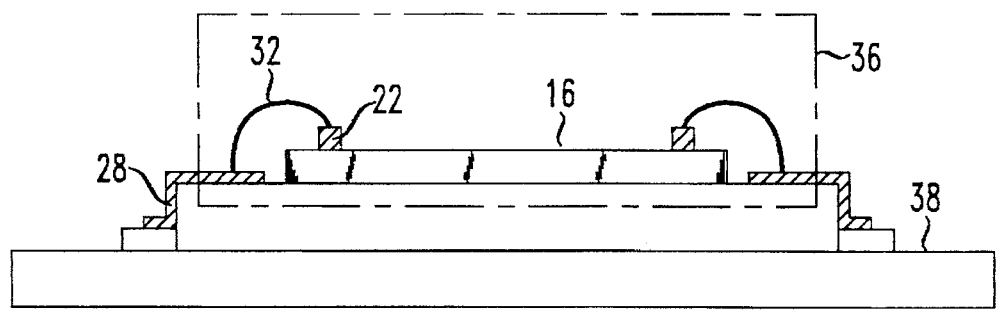
FIG. 3 is a cross-sectional view taken along line 3—3 of FIG. 2.

Referring to FIG. 3, there is shown a cross-sectional view taken along line 3—3 of FIG. 2. For illustration purposes, chip 16, wire bonds 32, and inner lead portions of terminals 28 are disposed within a standard plastic enclosure 36. It is noted that plastic enclosure 36, being an electrical insulator, does not provide an external electrical connection to bonding pads 22. Assembly 20 is mounted on a printed circuit board 38.

Referring now to FIGS. 4A–4E, there are shown simplified circuit diagrams of various embodiments of control circuits 18 and 18'.

Figure 4A:
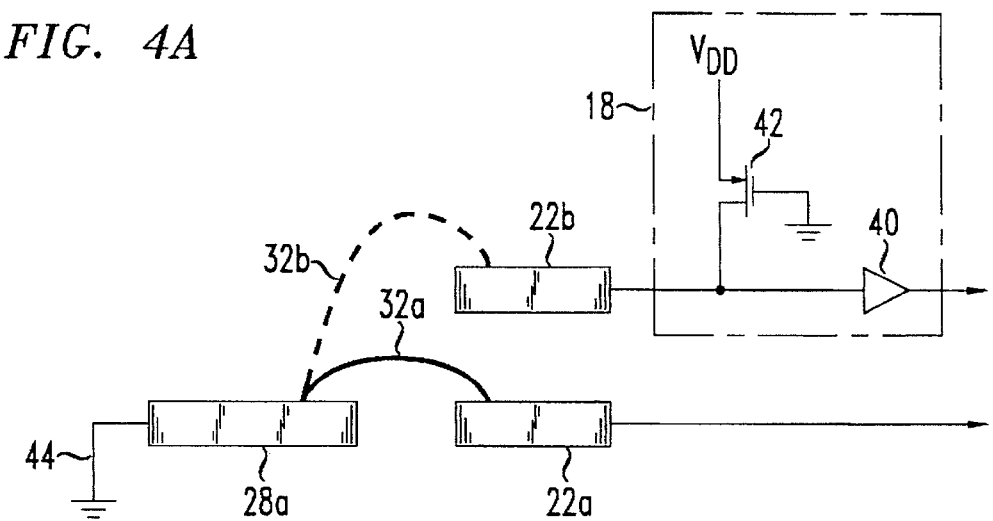
FIGS. 4A–4E are simplified circuit diagrams of various embodiments of control circuits in the chip in FIG. 2.

In FIG. 4A, control circuit 18 includes buffer 40 and P-channel MOSFET 42 coupled to bonding pad 22b. MOSFET 42 is "weak" in the sense that it is capable of maintaining bonding pad 22b at $V_{dd}$ against leakage currents but not against signal currents. Buffer 40 responds to a positive input voltage by outputting a first logic state (such as HIGH). Likewise, buffer 40 responds to a grounded input voltage by outputting a second logic state (such as LOW). When the output is LOW the first function is selected, when the output is HIGH the second function is selected. In this embodiment, terminal 28a is connected to ground by external connection 44 which is external to chip 16. Therefore, when optional wire bond 32b is present, the input of buffer 40 is grounded by connection 44 and buffer 40 signals LOW to select the first function. Alternatively, when optional wire bond 32b is absent, the input of buffer 40 is pulled to $V_{dd}$ by MOSFET 42 by default and buffer 40 signals HIGH to select the second function.

Figure 4B:
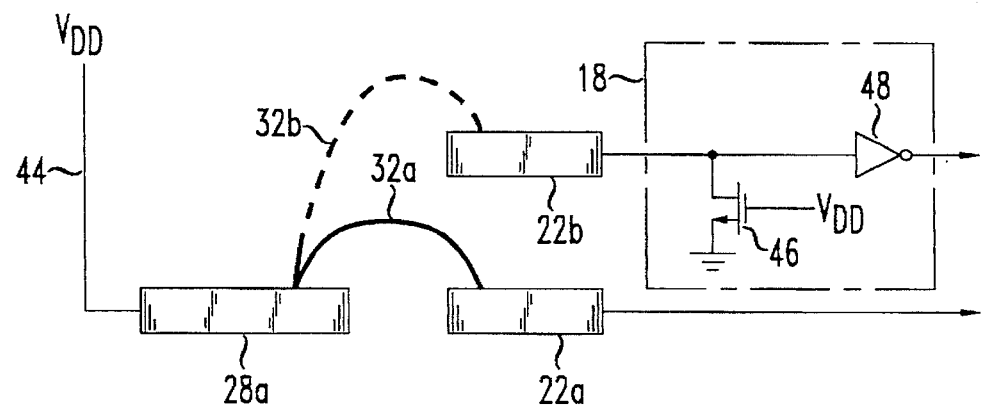

In FIG. 4B, control circuit 18 includes inverter 46 and N-channel MOSFET 48 coupled to bonding pad 22b. MOSFET 48 is "weak" in the sense that it is capable of maintaining bonding pad 22b at ground against leakage currents but not against signal currents. Inverter 46 responds to a positive input voltage by outputting a first logic state (such as LOW) to select the first function, whereas inverter 46 responds to a grounded input voltage by outputting a second logic state (such as HIGH) to select the second function. In this embodiment, terminal 28a is connected to $V_{dd}$ by external connection 44. Therefore, when optional wire bond 32b is present, the input of inverter 46 is pulled to $V_{dd}$ by external connection 44 and inverter 46 signals LOW to select the first function. Alternatively, when optional wire bond 32b is absent, the input of inverter 46 is grounded by MOSFET 48 by default and inverter 46 signals HIGH to select the second function.

Figure 4C:
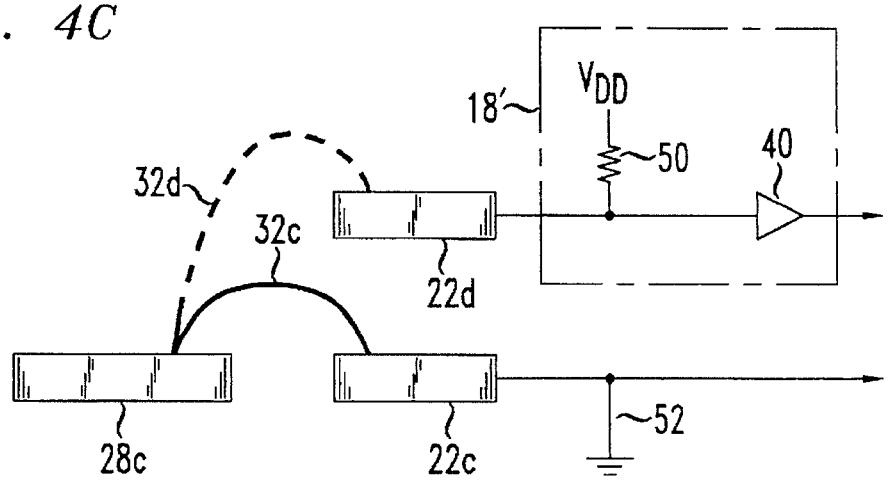

In FIG. 4C, control circuit 18' includes buffer 40 and resistor 50 coupled to bonding pad 22d. Resistor 50 has a high resistance and therefore is capable of maintaining bonding pad 22d at $V_{dd}$ against leakage currents but not against signal currents. In this embodiment, terminal 28c is devoid of an external electrical connection, and bonding pad 22c is coupled to ground by internal connection 52 in chip 16. Therefore, when optional wire bonds 32c and 32d are present, the input of buffer 40 is grounded by internal connection 52 and buffer 40 signals LOW to select the first function. Alternatively, when optional wire bonds 32c and 32d are absent, the input of buffer 40 is pulled to $V_{dd}$ by resistor 50 by default and buffer 40 signals HIGH to select the second function.

Figure 4D:
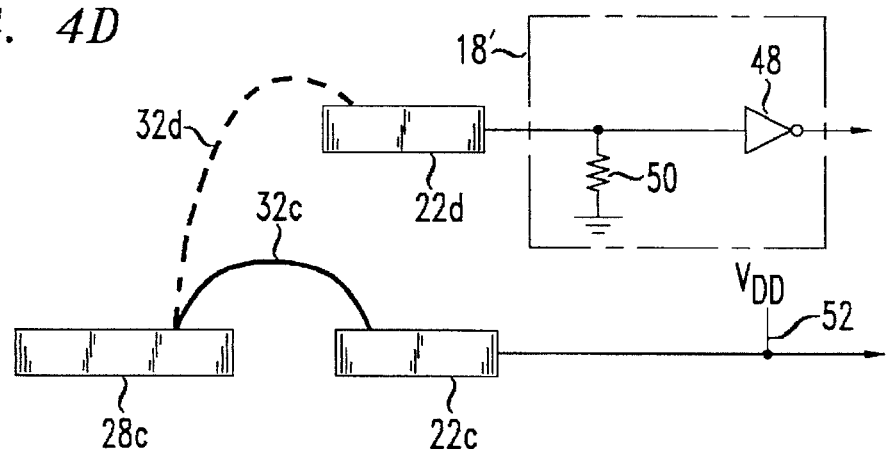

In FIG. 4D, control circuit 18' includes inverter 46 and resistor 50 coupled to bonding pad 22d. Since resistor 50 has a high resistance it is capable of maintaining bonding pad 22d ground against leakage currents but not against signal currents. In this embodiment, terminal 28c is devoid of an external electrical connection, and bonding pad 22c is coupled to $V_{dd}$ by internal connection 52. Therefore, when optional wire bonds 32c and 32d are present, the input of inverter 46 is pulled to $V_{dd}$ by internal connection 52 and inverter 46 signals LOW to select the first function. Alternatively, when optional wire bonds 32c and 32d are absent, the input of inverter 46 is grounded by resistor 50 by default and inverter 46 signals HIGH to select the second function.

Figure 4E:
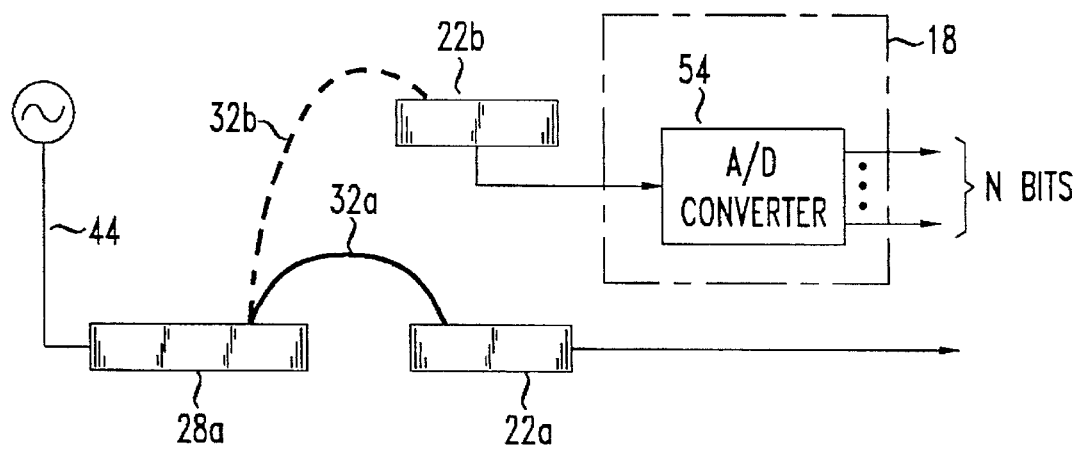

In FIG. 4E, control circuit 18 includes an analog-to-digital (A/D) converter 54. Converter 54 is a voltage-mode parallel-type converter with a resistor ladder network and $2^N-1$ comparators, and an N-bit priority encoder. The N-bit output of converter 54 may not only select the first or second function, but also select additional functions as well. This provides for multiordinal operation. For illustration purposes, the first function is selected if any output bit is HIGH, and the second function is selected only if every output bit is low. It is assumed that external connection 44 applies a time-varying analog signal of sufficient magnitude to trigger at least the least significant bit (LSB) of the output bits before the first function must be performed. Therefore, when optional wire bond 32b is present and the analog signal is applied, the LSB is HIGH which commands chip 16 to perform the first function. Alternatively, when optional wire bond 32b is absent, all output bits remain LOW which commands chip 16 to perform the second function.

Of course, the embodiments described herein are not exhaustive and, to some extent, are interchangeable. For example, resistor 50 could replace MOSFET 42 in FIG. 4A. Likewise, a pulsed reset signal could replace the constant $V_{dd}$ applied by external connection 44 in FIG. 4B. Furthermore, control circuit 18 may be responsive to currents rather than voltages. For example, control circuit 18 may include a current sensor so that when wire bond 32b is present, and a current is applied to terminal 28a, then the first function will be selected. In addition, die paddle 30 may serve as a single terminal 28 for bonding pads 22a and 22b, and/or for bonding pads 22c and 22d.

With respect to the first and second functions, it is essential that a default condition exist at control circuit 18, in the absence of optional wire bond 32b (thereby electrically isolating pads 22a and 22b), and that the default condition be forced to change due to the presence of optional wire bond 32b (thereby coupling pads 22a and 22b via wire bonds 32a and 32b and terminal 28a). Thus, if optional wire bond 32b is present, then it is essential that wire bonds 32a and 32b be part of a multiple wire bond at terminal 28a. Although not shown, terminal 28a may include additional wire bonds, for instance to form a triple or quadruple wire bond, if desired.

The present invention is well suited for providing a plurality of assemblies with separate functions. For instance, a plurality of assemblies 20 may be provided, with the assemblies being essentially identical to one another except that some assemblies contain wire bond 32b whereas other assemblies are devoid of wire bond 32b. This would result in some assemblies performing the first function but not the second function, and other assemblies performing the second function but not the first function. A user desiring the first function could be furnished with assemblies containing wire bonds 32b, whereas another user desiring the second function could be furnished with assemblies missing wire bonds 32b. Or, a user could be furnished with chips 16 and given wire bonding instructions for selecting the desired function. In addition, appropriate wire bonding data can be stored in the memory of an automated wire bonding system, which subsequently uses the wire bonding data defined for a selected function to wire bond chip 16 so that chip 16 performs the selected function.

Having described the preferred embodiments of this invention, it will now be apparent to one of ordinary skill in the art that other embodiments incorporating the concept may be used. Therefore, this invention should not be limited to the disclosed embodiments, but rather should be limited only by the spirit and scope of the appended claims.

The invention claimed is:

1. An electrical assembly comprising:
   a multifunctional integrated circuit chip comprising a plurality of separate bonding pads including first and second bonding pads;
   a plurality of conductive terminals including a first terminal;
   a plurality of wire bonds connected between selected bonding pads and terminals; and
   a control circuit coupled to the second bonding pad, the control circuit providing a first logic state to select the first function if the second bonding pad is coupled to the first bonding pad, the control circuit providing a second logic state to select the second function if the second bonding pad is electrically isolated from the first bonding pad, the chip providing a first function when the first bonding pad is wire bonded to the first terminal and the second bonding pad is separately wire bonded to the first terminal thereby forming a multiple wire bond at the first terminal and coupling the first and second bonding pads;
   the chip providing a second function when the second bonding pad is devoid of a wire bond thereby electrically isolating the first and second bonding pads.

2. The assembly of claim 1 wherein the first bonding pad is wire bonded to the first terminal and the second bonding pad is separately wire bonded to the first terminal so that the chip provides the first function.

3. The assembly of claim 1 wherein the second bonding pad is devoid of a wire bond so that the chip provides the second function.

4. The assembly of claim 3 wherein the first bonding pad is wire bonded to the first terminal.

5. An electrical assembly comprising:
   a multifunctional integrated circuit chip comprising a plurality of separate bonding pads for receiving wire bonds, the bonding pads including first and second adjacent bonding pads;
   a substrate comprising a conductive terminal;
   a first wire bond connected between the first bonding pad and the conductive terminal; and
   a control circuit coupled to the second bonding pad, the control circuit providing a first logic state for selecting the first function if the second bonding pad is coupled to the first bonding pad, the control circuit providing a second logic state for selecting the second function if the second bonding pad is electrically isolated from the first bonding pad, wherein the chip provides a first function when a second wire bond is connected between the second bonding pad and the conductive terminal thereby coupling the first and second bonding pads, and the chip provides a second function when the second bonding pad is devoid of an external electrical connection thereby electrically isolating the first and second bonding pads.

6. The assembly of claim 5 wherein the second wire bond is connected between the second bonding pad and the conductive terminal so that the chip provides the first function without providing the second function.

7. The assembly of claim 5 wherein the second bonding pad is devoid of an external electrical connection so that the chip provides the second function without providing the first function.

8. The assembly of claim 5 wherein the only external electrical connections received by the bonding pads are wire bonds.

9. A plurality of electrical assemblies for performing different functions, comprising:
   a first electrically assembly comprising a first multifunctional integrated circuit chip, a first substrate, and a first plurality of wire bonds;
   a second electrical assembly comprising a second multifunctional integrated circuit chip, a second substrate, and a second plurality of wire bonds; and
   a control circuit coupled to the second bonding pad, the control circuit providing a first logic state for selecting the first function if the second bonding pad is coupled to the first bonding pad, the control circuit providing a second logic state for selecting the second function if the second bonding pad is electrically isolated from the first bonding pad;
   wherein the first chip comprises a plurality of separate bonding pads for receiving wire bonds, the bonding pads including first and second adjacent bonding pads, the first chip devoid of an internal electrical connection between the first and second bonding pads;
   wherein the first substrate comprises a first plurality of conductive terminals including a first terminal;
   wherein the first plurality of wire bonds includes a first wire bond connected between the first bonding pad of the first chip and the first terminal, and a second wire bond connected between the second bonding pad of the first chip and the first terminal, thereby forming a multiple wire bond at the first terminal and coupling the first and second bonding pads of the first chip so that the first chip performs a first function;
   wherein thee second chip is essentially identical to the first chip;
   wherein the second substrate comprises a second plurality of conductive terminals including a second terminal;
   wherein the second plurality of wire bonds is devoid of a wire bond connected to the second bonding pad of the second chip, thereby electrically isolating the first and second bonding pads of the second chip so that the second chip performs a second function.

10. The assemblies of claim 9 wherein the only external electrical connections to the bonding pads of the first chip are the first plurality of wire bonds, and the only external electrical connections to the bonding pads of the second chip are the second plurality of wire bonds.

11. The assemblies of claim 10 wherein the second plurality of wire bonds further includes a third wire bond connected between the first bonding pad of the second chip and the second terminal.

12. In an assembly including a multifunctional integrated circuit chip and a substrate, the chip comprising a plurality of bonding pads peripherally disposed on a major surface of the chip, the bonding pads adapted to receive wire bonds, the bonding pads including first and second bonding pads, the chip including a control circuit coupled to the second bonding pad, the chip adapted to provide a first function or a second function depending on whether or not a first voltage is applied to the second bonding pad, the substrate comprising a plurality of conductive terminals adapted to receive wire bonds, the terminals including a first terminal, a method of operating the chip in one of the first and second functions, the method comprising the steps of:

performing one of steps (a) and (b):
  (a) wire bonding a first wire bond between the first bonding pad and the first terminal, and wire bonding a second wire bond between the second bonding pad and the first terminal, the first and second wire bonds using a single bond wire, to select the first function,
  (b) leaving the second bonding pad devoid of an external electrical connection to select the second function; and then applying the first voltage to the first terminal;

wherein if step (a) was performed then the first voltage is coupled from the first terminal to the second wire bond to the second bonding pad to the control circuit, and the control circuit responds to the first voltage at the second bonding pad by commanding the chip to perform the first function; and wherein if step (b) was performed then the first voltage is not coupled to the second bonding pad, and the control circuit responds to an absence of the first voltage at the second bonding pad by commanding the chip to perform the second function.

13. The method of claim 12 wherein the first voltage is a positive voltage.

14. The method of claim 12 wherein the first voltage is ground.

15. The method of claim 12 wherein the first voltage is applied to the first terminal by an external voltage source.

16. The method of claim 12 wherein the first voltage is applied to the first terminal by the first bonding pad.

17. The method of claim 16 wherein the first terminal is devoid of an external electrical connection.

18. The method of claim 12 wherein step (b) further comprises wire bonding the first wire bond between the first bonding pad and the first terminal.

19. The method of claim 12 wherein the first and second bonding pads are adjacent to one another.

20. The method of claim 19 wherein the first and second bonding pads are disposed adjacent to a single side of the major surface.

21. The method of claim 19 wherein the first and second bonding pads are disposed adjacent to respective first and second adjoining sides of the major surface.

* * * * *